United States Patent [19]

Burns

[11] 4,188,438
[45] Feb. 12, 1980

[54] ANTIOXIDANT COATING OF COPPER PARTS FOR THERMAL COMPRESSION GANG BONDING OF SEMICONDUCTIVE DEVICES

[75] Inventor: Carmen D. Burns, San Jose, Calif.

[73] Assignee: National Semiconductor Corporation, Santa Clara, Calif.

[21] Appl. No.: 582,634

[22] Filed: Jun. 2, 1975

[51] Int. Cl.² .................. B32B 3/10; H01L 21/02; H01L 21/60
[52] U.S. Cl. .................. 428/209; 29/576 R; 29/577 R; 29/590; 148/6.15 R; 148/6.2; 427/89; 427/96; 428/901
[58] Field of Search ............ 427/88, 92, 96, 98, 427/89, 299, 309, 322, 327, 328; 148/6.15 R, 6.2, 6.21; 428/195, 209, 210, 457, 901; 29/203 B, 577, 569 R, 576 R, 577 R, 577 G, 589–591, 624–626; 357/70, 71

[56] References Cited

U.S. PATENT DOCUMENTS

| | | | |
|---|---|---|---|
| 1,927,671 | 9/1933 | Shiraishi | 148/6.21 |
| 2,628,925 | 2/1953 | Ostrander | 148/6.21 |
| 3,162,512 | 12/1964 | Robinson | 427/437 X |
| 3,214,292 | 10/1965 | Edson | 427/436 |
| 3,480,841 | 11/1969 | Castrucci et al. | 29/589 X |
| 3,764,399 | 10/1973 | Caule | 148/6.15 R |
| 3,764,400 | 10/1973 | Caule | 148/6.15 R X |
| 4,000,842 | 1/1977 | Burns | 357/71 X |
| 4,005,472 | 1/1977 | Harris et al. | 357/71 |
| 4,042,954 | 8/1977 | Harris | 357/71 |

FOREIGN PATENT DOCUMENTS 735394  5/1966  Canada ........................... 427/92

*Primary Examiner*—Bruce H. Hess
*Attorney, Agent, or Firm*—Gail W. Woodward

[57] ABSTRACT

Copper parts associated with thermal compression bonding of lead structures to a semiconductive device, such as the lead frame, the interconnect lead, and the gang bonding bumps, are coated with an antioxidant material. The antioxidant material and its thickness are chosen to be compatible with thermal compression bonding therethrough so that the completed thermal compression bond forms a bonding interface to the copper through the antioxidant coating. Suitable antioxidant coating materials include, gold, chromate, and copper phosphate.

17 Claims, 6 Drawing Figures

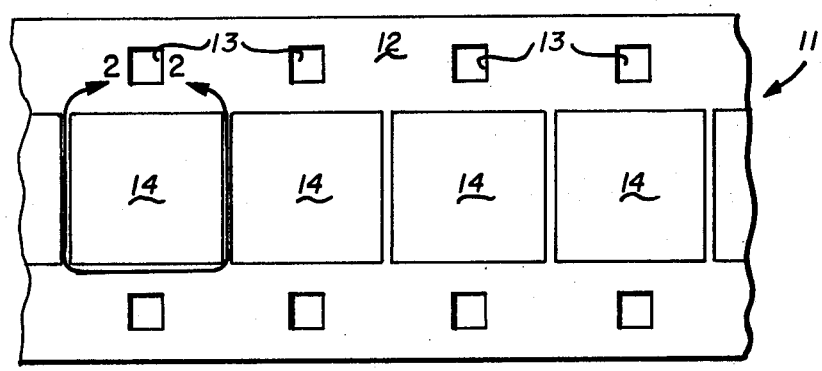
Fig_1
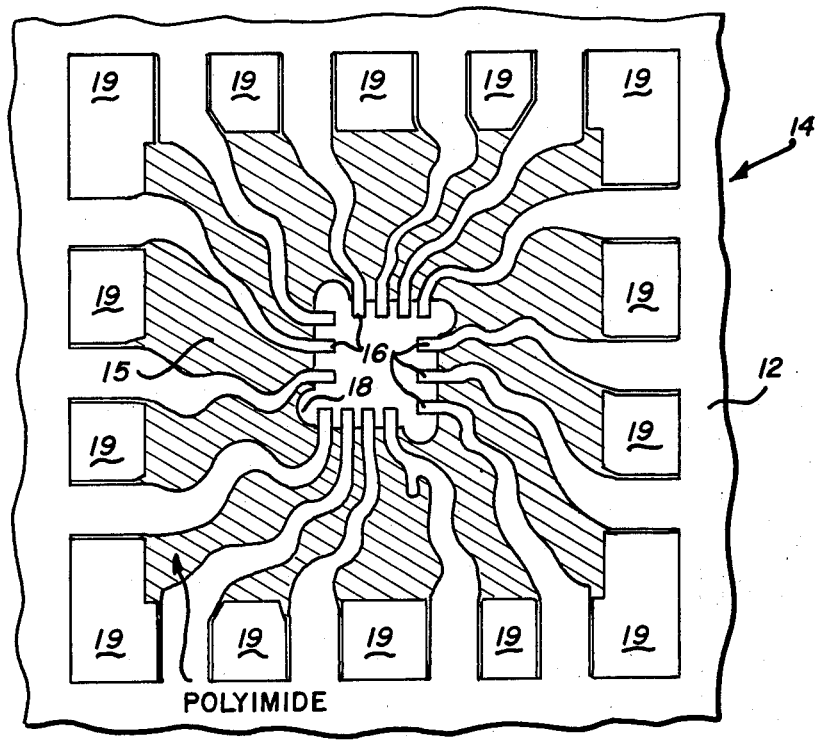
Fig_2
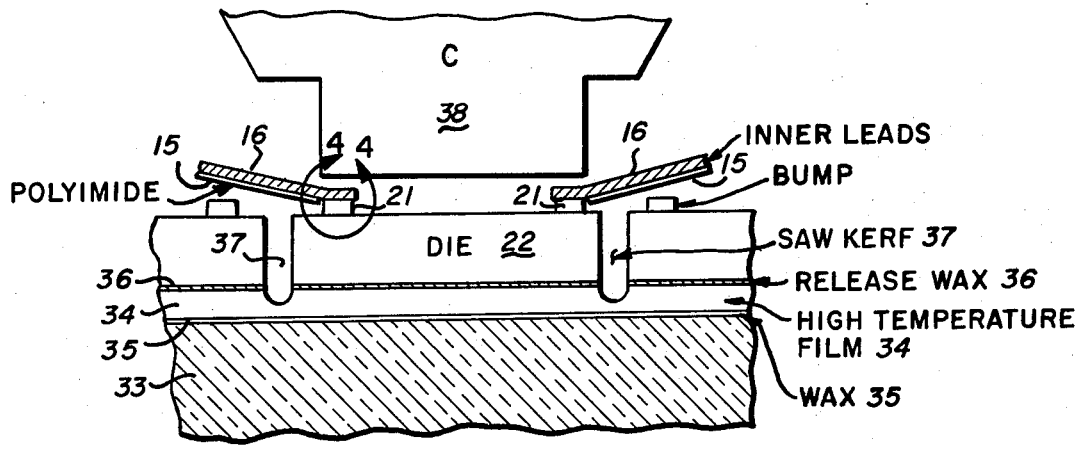
Fig_3

ANTIOXIDANT COATING OF COPPER PARTS FOR THERMAL COMPRESSION GANG BONDING OF SEMICONDUCTIVE DEVICES

BACKGROUND OF THE INVENTION

The present invention relates in general to thermal compression gang bonding of semiconductive devices and, more particularly, to gang bonding of copper members associated with the semiconductive device, such copper members including, for example, the lead frame, interconnect leads and the gang bonding bumps on the semiconductive device.

DESCRIPTION OF THE PRIOR ART

Heretofore, thermal compression gang bonding of semiconductive devices has been accomplished. In these prior bonds, a copper pattern of ribbon-shaped interconnect leads was coated with a nickel layer and the nickel layer was plated with gold to a thickness within the range of 30-60 microinches. The interconnect ribbon leads were then gang bonded to gold gang bonding bumps carried from and rising above the surface of the semiconductive device to be gang bonded. During the thermal compression gang bonding step, the nickel layer served as a barrier under the gold layer so that a gold-to-gold bond was obtained between the gold plated copper interconnect lead and the gold gang bonding bump. A similar gold-to-gold thermal compression bond was obtained at the outer end of the interconnect lead between the interconnect lead and the lead frame.

One of the problems with this gold-to-gold thermal compression bonding technique is that the expense is relatively high due to the cost of the gold employed in making the bonds.

SUMMARY OF THE PRESENT INVENTION

The principal object of the present invention is the provision of an improved method for thermal compression gang bonding of copper portions of structures to be connected to a semiconductor device.

In one feature of the present invention, copper portions of structures for interconnecting a semiconductive device to a circuit are thermal compression gang bonded through a very thin antioxidant coating over the copper, such coating being of a material and thickness compatible with thermal compression bonding therethrough to the underlying copper.

In another feature of the present invention, copper gang bonding bumps, provided on a semiconductive device for thermal compression bonding to lead structures, are coated with an antioxidant coating of a material and thickness which is compatible with thermal compression bonding through the antioxidant coating to the underlying copper so that the copper forms a bonding interface with the bonded lead structure.

In another feature of the present invention the antioxidant coating for the copper portion of the thermal compression bond is selected from the group consisting of gold, chromate, and copper phosphate.

In another feature of the present invention, the interconnect lead structure which is to be bonded at its inner end to gang bonding bumps on the semicondutive device is made of copper and has a thin antioxidant coating thereon, the material and the thickness of the antioxidant coating being compatible with a thermal compression bonding therethrough to the copper interconnect lead structure.

In another feature of the present invention, a lead frame structure, for thermal compression gang bonding to the outer regions of a metallic interconnect lead structure, is made of copper or includes a copper layer to which a bond is to be made, such copper portion of the lead frame structure being coated with an antioxidant coating of a material and of a thickness compatible with thermal compression gang bonding therethrough so that the bonding interface is made to the copper portion of the lead frame structure.

Other features and advantages of the present invention will become apparent upon a perusal of the following specification taken in connection with the accompanying drawings wherein:

BRIEF DESCRIPTION OF THE DRAWINGS

FIG. 1 is a plan view of a film type gang bonding tape having the metallic interconnect lead patterns thereon for thermal compression bonding to semiconductive chips or dies by an automatic gang bonding machine, FIG. 2 is an enlarged plan view of a portion of the structure of FIG. 1 delineated by line 2—2, FIG. 3 is an enlarged sectional view of a thermal compression die bonding head for gang bonding the interconnect lead structures to gang bonding bumps on the semiconductive chip or die.

DESCRIPTION OF THE PREFERRED EMBODIMENTS

Figure 4:
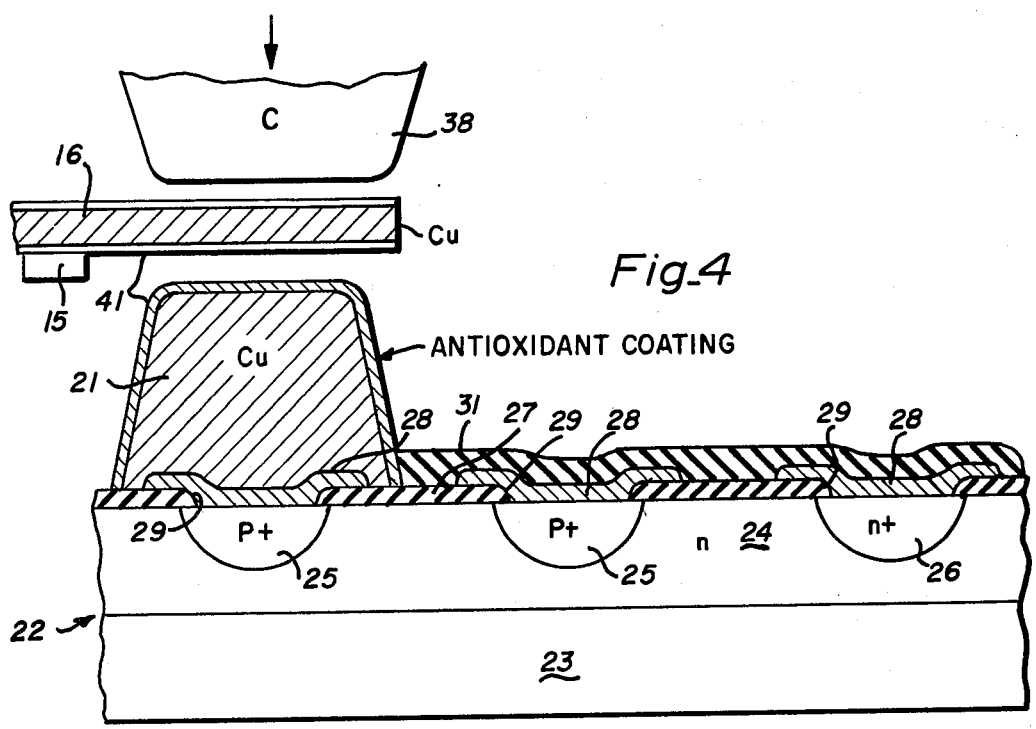
FIG. 4 is an enlarged detail view of a portion of the structure of FIG. 3 delineated by line 4—4.

Referring now to FIGS. 1 and 2 there is shown the bonding tape 11 for use in an automatic thermal compression gang bonding machine for attaching the interconnect leads to the die. The tape 11 includes a wrought copper sheet 12 perforated at 13 along its opposite marginal edges to receive a sprocket drive wheel therein for advancing the tape from a supply reel through the automatic gang bonding machine. A plurality of interconnect lead patterns of metallic foil 14 are formed in the wrought copper foil 12, the typical pattern being shown in FIG. 2. A polyimide plastic film 15 is adhered to the underside of the copper sheet 12 for holding the interconnect lead portions 16 of the pattern 14 in the desired positions. A rectangular central aperture 18 is provided in the film 15 with the inner ends of the interconnect lead ribbons 16 extending over the lip of the rectangular aperture 18. A plurality of perforations 19 are disposed about the periphery of the interconnect lead patterns 14 to facilitate shearing of the foil 12 and film 15 in a subsequent step of the bonding process.

Referring now to FIGS. 3 and 4, there is shown the die bonding machine for thermal compression gang bonding of the inner ends of the interconnect leads 16 to a plurality of gang bonding bumps 21 disposed about the periphery of a die or semiconductive chip 22.

The individual chips 22 include a semiconductive substrate portion 23 having an epitaxial n type conductivity region 24 grown thereon. A plurality of p+ conductivity regions 25 are diffused into the n region 24. An n+ conductivity region 26 is diffused into the n epitaxial layer 24 for making electrical contact thereto. The upper surface of the n layer 24 is coated with a passivation layer 27 of silicon dioxide.

A plurality of apertures 29 are provided in the silicon dioxide layer 27 in registration with certain of the regions 25 and 26 and an interconnect pattern of metallization 28, as of aluminum, is deposited through the apertures 29 for making electrical contact to the n+ and p+ type regions. In certain regions, the gang bonding bumps 21 are deposited, as by electroplating, over the intraconnect pattern of metallization 28 for making electrical contact thereto. In a typical example, the gang bonding bumps 21 are one to two mils high and have a cross-section at their base of approximately 12 square mils. In other regions of the semiconductive die 22, the intraconnect pattern of metallization 28 is covered over with a second passivation layer 31, as of silicon dioxide.

The semiconductive die or chip 22 is carried from a glass plate 33 via a high temperature film 34 joined to the glass plate 33 via wax 35. The die is carried from the film 34 via the intermediary of a layer of release wax 36. The assembly is scored by saw kerfs passing through the release wax and partially into the high temperature film 34.

The die bonding machine brings the individual chips, to be bonded, into registration with a die bonding tool 38, as of beryllia ceramic, heated to a temperature of, for example, 550° C. for gang bonding. The tool 38 is caused to press the inner ends of the interconnect leads 16 down onto the upper ends of the gang bonding bumps 21 with a pressure of approximately 100 grams per bump or 8 grams per square mil for a time of approximately 0.2 seconds. In a typical example, the bonding tool 38 gang bonds 14 gang bonding bumps 21 simultaneously.

In my prior gang bonding attempts, it was found that when thermal compression bonds were attempted to be made between a copper interconnect lead 16 and a bare copper gang bonding bump 21 that relatively poor bonds were obtained due to the presence of a copper oxide layer formed on the surfaces of the copper. This copper oxide layer interferred with obtaining strong thermal compression bonds between the copper parts. However, it has been discovered that when the copper parts 16 and 21 are coated with an antioxidant coating to prevent oxidation thereof and when the antioxidant coating 41 is sufficiently thin so that a thermal compression bond is obtained through the antioxidant layer to the underlying copper, that strong thermal compression bonds are obtained to the copper. Typically, it is found that the copper-to-copper bonds obtained in this manner are stronger than the leads 16.

Suitable antioxidant coatings 41 include gold, chromate, and copper phosphate such antioxidant coatings are deposited to thicknesses sufficiently thin to permit thermal compression gang bonding therethrough.

In the case of gold, the antioxidant coating 41 preferably has a thickness less than 6000 angstroms. The antioxidant coating permits the parts to be stored and handled without adversely affecting the thermal compression bond to be obtained thereto. The gold antioxidant coating is preferably applied, especially to the copper gang bonding bumps 21, by the gold immersion coating process. Such a coating process is disclosed and claimed in copending U.S. application Ser. No. 578,651 filed May 19, 1975, now U.S. Pat. No. 4,005,472, and assigned to the same assignee as the present invention. Otherwise the gold coating is applied by conventional electroplating processes.

Chromatic antioxidant coatings are applied to the copper portions by cleaning the copper portions with hydrochloric acid and then immersing the copper parts or devices having exposed copper parts in a plating solution of chromic acid mixed with $H_2SO_4$ acid such mixture being 2.0% chromic acid to 8.0% full strength $H_2SO_4$ acid to 90% deionized water by volume. The parts are immersed for one minute at room temperature then removed, rinsed in deionized water and dried. In this process the chromate is deposited on the copper surface to a thickness of between 10 and 100 angstroms.

The copper phosphate antioxidant coating is applied to the exposed copper portions by cleaning the copper portions with HCl followed by rinsing thereof in deionized water. The exposed copper portions are preferably roughened to an RMS surface roughness of about $20\mu''$. The copper portions are then oxidized by heating thereof in air at 270° C. for 10 minutes. The oxidized copper portions are then immersed for 15 seconds in a solution of phosphoric acid at 84% strength at room temperature. After immersion the parts are rinsed with deionized water and dried. The antioxidant copper phosphate coating applied by this process has a thickness falling within the range of 100 to 2000 angstroms.

When the die 22 is gang bonded to the inner ends of the interconnect lead patterns, due to the heating of the die by the thermal compression tool 38, the wax releases the die and it is thereby transferred to the wrought copper sheet or tape 12. The tape 12 with the dies attached thereto is fed through a second machine which thermal compression bonds the outer portions of the interconnect leads 16 to the inner ends of the lead frame members 43 (see FIGS. 5 and 6). In a typical example, lead frame members 43 are made of kovar, alloy 42, or copper. In the case that the lead frames 43 are made of either kovar or alloy 42 they are typically plated with a relatively thick layer 44 of copper to facilitate bonding to the outer ends of the copper interconnect leads 16. Again the copper layer 44 of the lead frame 43 and preferably the surface of the interconnect lead 16 which is to be thermal compression bonded thereto are coated with the thin layers of antioxidant material such as gold, chromate or copper phosphate to the thicknesses previously prescribed herein.

For bonding the outer lead frames 43 to the outer ends of the interconnect leads 16, the thermal compression tool 46 is brought up against the lower side of the interconnect lead 16 for pressing the upper surface of the interconnect lead into engagement with the lower surface of the antioxidant coated lead frame. In a typical example the temperature of the bonding tool is 450° C. and is held in engagement with the interconnect lead for approximately 0.15 seconds and the bonding pressure is typically approximately three times the pressure utilized for bonding the inner ends of the interconnect leads 16 to the copper gang bonding bumps 21.

Figure 5:
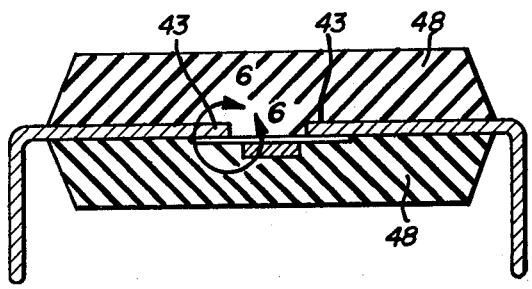
FIG. 5 is a sectional view of an integrated circuit package having an integrated circuit die or chip mounted to a lead frame structure therein.
Figure 6:
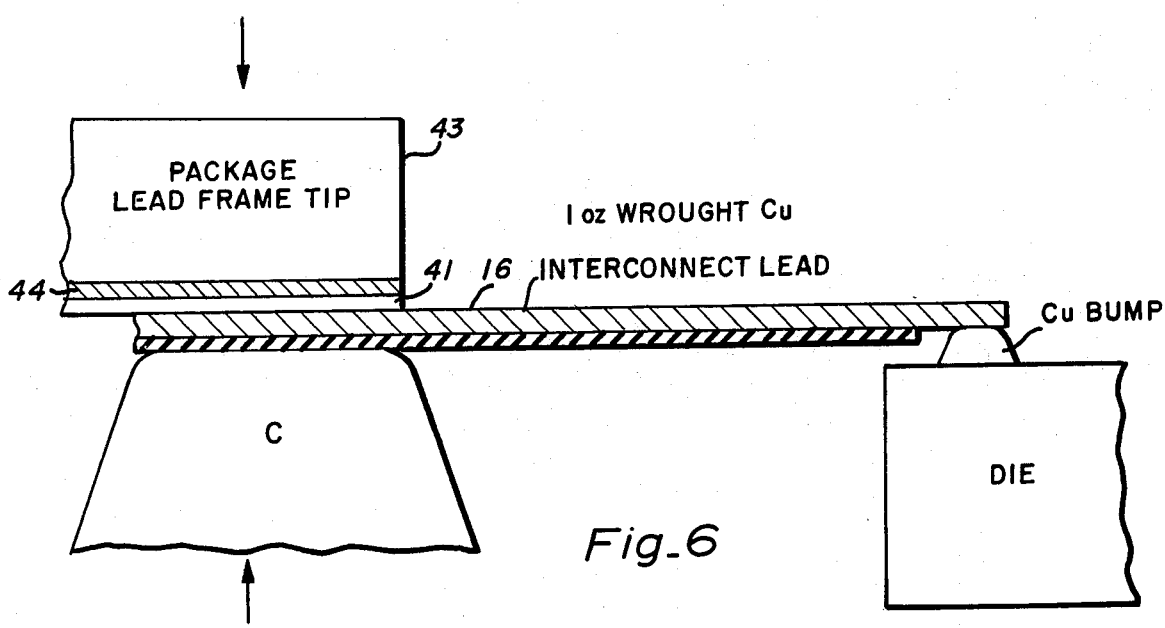
FIG. 6 is an enlarged detail view of a portion of the structure of FIG. 5 delineated by line 6—6.

Bond strengths achieved between the copper interconnect lead 16 and the copper layer 44 on the lead frame 43 are usually greater than 50 grams and have been as high as 200 grams for a 225 square mil thermal compression copper interface bond area between the lead frame 43 and the outer end of the interconnect lead 16. After the lead frames have been bonded to the interconnect leads 16, the lead frames are mounted in an epoxy mold package 48 as shown in FIG. 5.

As the thermal compression bond is made between the interconnect lead 16 and the inner ends of the lead frame 43, the copper interconnect lead pattern 14 is sheared along the line of the perforations 19, thereby transferring the lead attached die 22 from the tape 11 to the lead frame structure 43.

The advantage to the use of antioxidant coated copper members to form one of the bonding interfaces of thermal compression bonds in lead structures to be connected to semiconductive devices according to the present invention is that relatively inexpensive copper members may be utilized with relatively inexpensive antioxidant coatings. The resultant bonds have high bond strength and high reliability while permitting the parts to have relatively long shelf life and to be handled without deleteriously affecting the yields.

What is claimed is:

1. In a method for thermal compression gang bonding of lead structures to be connected to a semiconductive device, such semiconductive device being of a type having a plurality of metallic gang bonding bumps rising above the surface of the semiconductive device and being connected at their bases to underlying patterns of metallization on the semiconductive device, and wherein at least one copper portion operatively associated with the semiconductive device is to be thermal compression gang bonded to a second metal portion operatively associated with the semiconductive device, the steps of:

coating said first copper portion with an antioxidant coating to inhibit oxidation of the copper portion, such antioxidant coating being applied to a thickness and of a material compatible with thermal compression bonding therethrough so that the completed thermal compression bond to be effected between said first copper portion and said second metal portion is bonded through said antioxidant coating, said first copper portion forming a bonding interface with said second metal portion.

2. The method of claim 1 wherein said antioxidant coating is of gold.

3. The method of claim 2 wherein the gold coating is less than 6000 angstroms thick.

4. The method of claim 1 wherein the antioxidant coating is of a material selected from the group consisting of chromate, and copper phosphate.

5. The method of claim 1 wherein the antioxidant coating is of chromium.

6. The method of claim 1 wherein the antioxidant coating is of copper phosphate.

7. The method of claim 1 wherein said first copper portion comprises said thermal compression gang bonding bumps.

8. The method of claim 7 wherein said antioxidant coating is gold.

9. The method of claim 8 wherein the thickness of the gold antioxidant coating on said copper bumps is less than 6000 angstroms thick.

10. The method of claim 1 wherein said first copper portion comprises a portion of an interconnect lead for thermal compression gang bonding to said gang bonding bumps at its inner end and for thermal compression gang bonding at its outer end to a lead frame structure.

11. The method of claim 1 wherein said first copper portion comprises a lead frame structure for thermal compression gang bonding to the outer regions of a metal interconnect lead portion to be thermal compression gang bonded at its inner regions to said gang bonding bumps.

12. In an apparatus for thermal compression gang bonding of lead structures to be connected to a semiconductive device, such semiconductive device being of the type having a plurality of metallic gang bonding bumps rising above the surface of the semiconductive device and being connected at their bases to patterns of metallization on the semiconductive device:

a first copper portion operatively associated with the semiconductive device and which is to be thermal compression gang bonded to a second metal portion operatively associated with the semiconductive device;

said first copper portion having an antioxidant coating thereon to inhibit oxidation of said copper portion, such antioxidant coating being of a thickness and of a material compatible with thermal compression bonding therethrough so that the completed thermal compression bond to be effected between said first copper portion and the second metal portion is bonded through said antioxidant coating with said first copper portion forming a bonding interface with said second metal portion.

13. The apparatus of claim 12 wherein said antioxidant coating is of gold.

14. The apparatus of claim 13 wherein said gold antioxidant coating is less than 6000 angstroms thick.

15. The apparatus of claim 12 wherein said antioxidant coating is of a material selected from the group consisting of chromate, gold, and copper phosphate.

16. The apparatus of claim 12 wherein said first copper portion comprises a portion of an interconnect lead for thermal compression gang bonding to said gang bonding bumps at the inner end thereof and for thermal compression gang bonding at the outer end thereof to a lead frame structure.

17. The apparatus of claim 12 wherein said first copper portion comprises a lead frame structure for thermal compression gang bonding to the outer regions of a metal interconnect lead structure to be thermal compression gang bonded at its inner region to said gang bonding bumps.

* * * * *